United States Patent
Tsang

(10) Patent No.: US 8,242,529 B2
(45) Date of Patent: Aug. 14, 2012

(54) LIGHT EMITTING CHIP AND METHOD FOR MANUFACTURING THE SAME

(75) Inventor: Jian-Shihn Tsang, New Taipei (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 13/052,131

(22) Filed: Mar. 21, 2011

(65) Prior Publication Data

US 2012/0168793 A1     Jul. 5, 2012

(30) Foreign Application Priority Data

Dec. 30, 2010   (TW) .............................. 99146774 A

(51) Int. Cl.
- H01L 33/00    (2010.01)
- H01L 23/495   (2006.01)
- H01L 21/00    (2006.01)

(52) U.S. Cl. ..... 257/98; 257/675; 257/796; 257/E23.08; 257/E51.04; 438/122

(58) Field of Classification Search .................... 257/98, 257/675, 796, E23.08, E51.04; 438/122
See application file for complete search history.

(56) References Cited

U.S. PATENT DOCUMENTS

| | | | |
|---|---|---|---|
| 7,400,029 B2* | 7/2008 | Shimada et al. | 257/625 |
| 7,834,434 B2* | 11/2010 | Shimada et al. | 257/675 |
| 7,915,620 B2* | 3/2011 | Ishida et al. | 257/79 |
| 8,039,961 B2* | 10/2011 | Suhir et al. | 257/751 |
| 8,053,069 B2* | 11/2011 | Katagiri et al. | 428/293.1 |
| 8,106,510 B2* | 1/2012 | Altman et al. | 257/739 |
| 2006/0090885 A1* | 5/2006 | Montgomery et al. | 165/104.33 |
| 2010/0143691 A1* | 6/2010 | Katagiri et al. | 428/293.7 |

* cited by examiner

*Primary Examiner* — Jarrett Stark
*Assistant Examiner* — Nicholas Tobergte
(74) *Attorney, Agent, or Firm* — Altis Law Group, Inc.

(57) ABSTRACT

A light emitting chip includes a substrate, an epitaxial structure comprising a first semiconductor layer, a light emitting layer and a second semiconductor layer, a current conducting structure formed on a bottom side of the first semiconductor layer of the epitaxial structure, and heat conducting protrusions formed on a top side of the substrate. Each of the heat conducting protrusions includes a carbon nanotube layer vertically grown thereon. The heat conducting protrusions are embedded into the current conducting structure to thermally connect with the first semiconductor layer. A method for manufacturing the light emitting chip is also disclosed.

20 Claims, 4 Drawing Sheets

LIGHT EMITTING CHIP AND METHOD FOR MANUFACTURING THE SAME

BACKGROUND

1. Technical Field

The present disclosure relates to a light emitting chip and a method for manufacturing the light emitting chip, and more particularly, to a light emitting chip having enhanced heat dissipation capability.

2. Description of Related Art

As new type light source, LEDs are widely used in various applications. An LED often includes an LED chip to emit light. A conventional LED chip includes a substrate, an N-type semiconductor layer, a light-emitting layer and a P-type semiconductor layer sequentially grown on the substrate. The substrate is generally made of sapphire ($Al_2O_3$) for providing the growing environment for the semiconductor layers. However, such sapphire substrate has a low heat conductive capability, causing that heat generated by the semiconductor layers cannot be timely and effectively dissipated.

What is needed, therefore, is a light emitting chip and a method for manufacturing the light emitting chip which can overcome the limitations described above.

BRIEF DESCRIPTION OF THE DRAWINGS

Many aspects of the present embodiments can be better understood with reference to the following drawings. The components in the drawings are not necessarily drawn to scale, the emphasis instead placed upon clearly illustrating the principles of the present embodiments. Moreover, in the drawings, like reference numerals designate corresponding parts throughout the various views.

DETAILED DESCRIPTION

Figure 1:
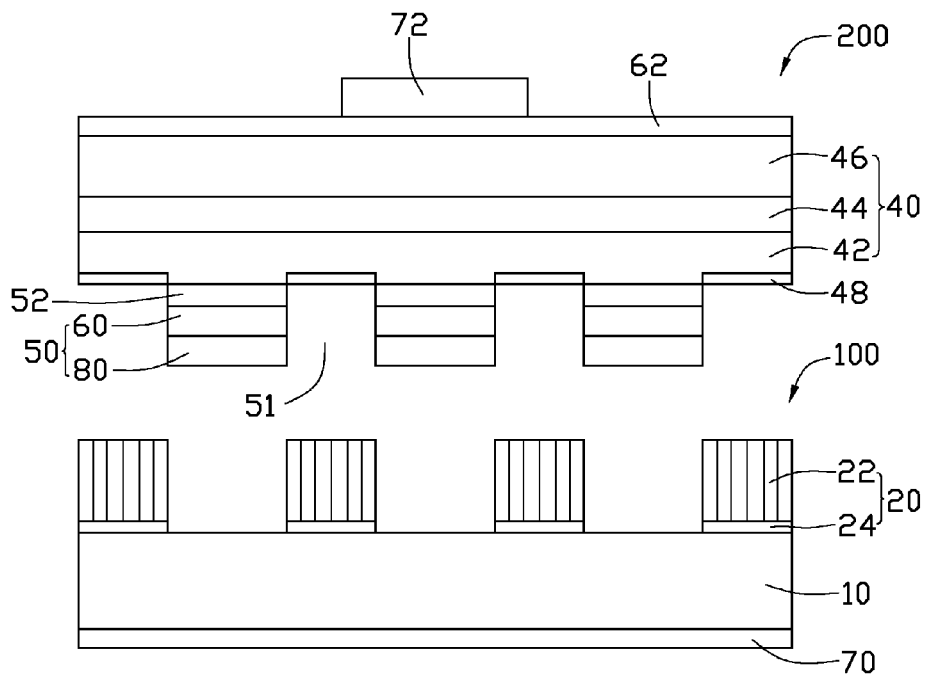
FIG. 1 is an exploded, schematic view of a light emitting chip in accordance with a first embodiment of the present disclosure.

Referring to FIG. 1, a light emitting chip in accordance with a first embodiment of the present disclosure is illustrated. The light emitting chip comprises a first semiconductor structure 100 and a second semiconductor structure 200 bonded to the first semiconductor structure 100 by wafer bonding technique. The first semiconductor structure 100 comprises a substrate 10 and a plurality of heat conducting protrusions 20 formed on a top side of the substrate 10. The heat conducting protrusions 20 are spaced from each other. The second semiconductor structure 200 comprises an epitaxial structure 40 and a current conducting structure 50 formed on a bottom side of the epitaxial structure 40. The current conducting structure 50 defines a plurality of holes 51 therein. The heat conducting protrusions 20 are fitly embedded into the holes 51 of the current conducting structure 50 in such a manner that top surfaces of the heat conducting protrusions 20 are attached to a bottom surface of the epitaxial structure 40 and a bottom surface of the current conducting structure 50 is attached to a top surface of the substrate 10.

The substrate 10 is made of SiC, Si, GaN or ZnO. Each of the heat conducting protrusions 20 comprises a catalyst layer 24 and a carbon nanotube layer 22. The material of the catalyst layer 24 may be selected from Fe, Co, Ni, Mo or other suitable transition metals. The catalyst layer 24 is used for providing growing medium for the carbon nanotube layer 22. The catalyst layer 24 can be grown on the whole top surface of the substrate 10 via MOCVD (Metal-Organic Chemical Vapor Deposition) or other suitable methods and then etched to form a plurality of chunks spaced from each other. The carbon nanotube layer 22 is vertically grown from the catalyst layer 24 by reaction of a gas combination containing $CH_4$, $H_2$, $N_2$, $C_2N_4$ and Ar on a top surface of each chunk of the catalyst layer 24.

The epitaxial structure 40 comprises a first semiconductor layer 42, a light emitting layer 44 and a second semiconductor layer 46. In this embodiment, the first semiconductor layer 42 is a P-type GaN layer, the second semiconductor layer 46 is an N-type GaN layer, and the light emitting layer 44 is a multi-quantum well GaN/InGaN layer. Also referring to FIG. 4, the epitaxial structure 40 is grown on a temporary substrate 90 by sequentially forming the second semiconductor layer 46, the light emitting layer 44 and the first semiconductor layer 42. The temporary substrate 90 is removed from the second semiconductor layer 46 by laser, chemical etching, physical etching or milling to expose the second semiconductor layer 46 after the epitaxial structure 40 is formed. Back to FIG. 1, in this embodiment, the first semiconductor layer 42 defines a plurality of recesses 48 in a bottom surface thereof by chemical etching, physical etching or milling so that the heat conducting protrusions 20 are embedded into the first semiconductor layer 42. In other embodiments, there can be no recesses 48 in the bottom surface of the first semiconductor layer 42. In this embodiment, the recesses 48 correspond to the holes 51 in the current conducting structure 50.

The current conducting structure 50 is formed on the bottom surface of the first semiconductor layer 42 except the recesses 48. The current conducting structure 50 comprises a first transparent conductive layer 60 formed on the bottom surface of the first semiconductor layer 42 except the recesses 48 and a current conducting layer 80 formed on a bottom surface of the first transparent conductive layer 60.

In this embodiment, an ohmic contact layer 52 is formed between the first transparent conductive layer 60 and the bottom surface of the first semiconductor layer 42, for decreasing contact resistance therebetween. The ohmic contact layer 52 may be a P-doped GaN layer or a P-type superlattice layer.

A second transparent conductive layer 62 is formed on a top surface of the second semiconductor layer 46. The first and second transparent conductive layers 60, 62 may be made of ITO (indium tin oxide) or an alloy of Ni/Au. The first and second transparent conductive layers 60, 62 can distribute current to uniformly flow through the first and second semiconductor layers 42, 46, respectively. A first electrode 70 is formed on a bottom surface of the substrate 10. Preferably, the first electrode 70 is an ohmic contact metal layer for favorable ohmic contact with the substrate 10. A second electrode 72 is formed on a central part of a top surface of the second transparent conductive layer 62, providing a bonding pad for the light emitting chip.

The current conducting layer 80 may be made of metal having high reflective index, such as Au or Ag, for reflecting light downwardly emitted from the light emitting layer 44 towards the second transparent conductive layer 62, thereby increasing light-extracting efficiency of the light emitting chip. Alternatively, the current conducting layer 80 can also be in the form of electrically conductive DBR (Distributed Bragg Reflector) which is made by alternating multiple high refractive layers with multiple low refractive layers. The DBR layer can have a relatively high reflective efficiency approximate to 99% so that almost all of the light can be reflected back towards the second transparent conductive layer 62. The first electrode 70 and the second electrode 72 are used to join other electrical structures (such as golden wires) to electrically connect the light emitting chip with the other electrical structures.

Figure 2:
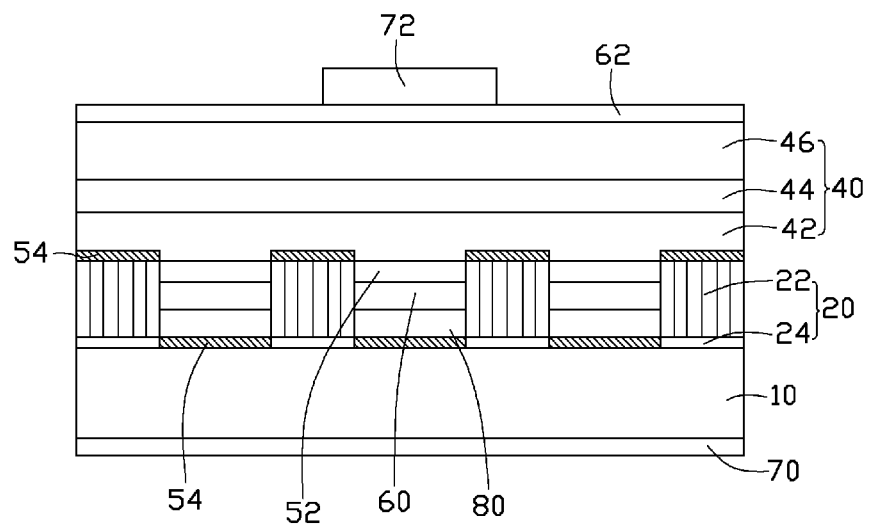
FIG. 2 is an assembled, schematic view of the light emitting chip of FIG. 1.

Referring also to FIG. 2, before wafer bonding between the first semiconductor structure 100 and the second semiconductor structure 200, an adhesive layer 54 is presented on one of the first semiconductor structure 100 and the second semiconductor structure 200 or both so that the first semiconductor structure 100 and the second semiconductor structure 200 can be adhesively connected together. The adhesive layer 54 is formed on a horizontal contact surface between the first and second semiconductor structures 100, 200. The adhesive layer 54 is made of transparent and conductive materials.

Since the carbon nanotubes have a relatively high heat conductive index more than 2000W/m.K, the heat generated by the light emitting layer 44 can be effectively dissipated by the carbon nanotube layer 22. Especially, the carbon nanotube layer 22 directly transfers the heat on the first semiconductor layer 42 to the substrate 10. The carbon nanotube layer 22 is also electrically conductive, for transferring current between the first semiconductor layer 42 and the substrate 10.

For a light emitting chip emitting blue light, the first semiconductor layer 42 has a relatively high resistance. When the light emitting chip is working, the heat generated by the first semiconductor layer 42 is higher than that generated by the second semiconductor layer 46. The carbon nanotube layer 22 directly transfers the heat on the first semiconductor layer 42 to the substrate 10, effectively reducing the temperature of the epitaxial structure 40.

Figure 4:
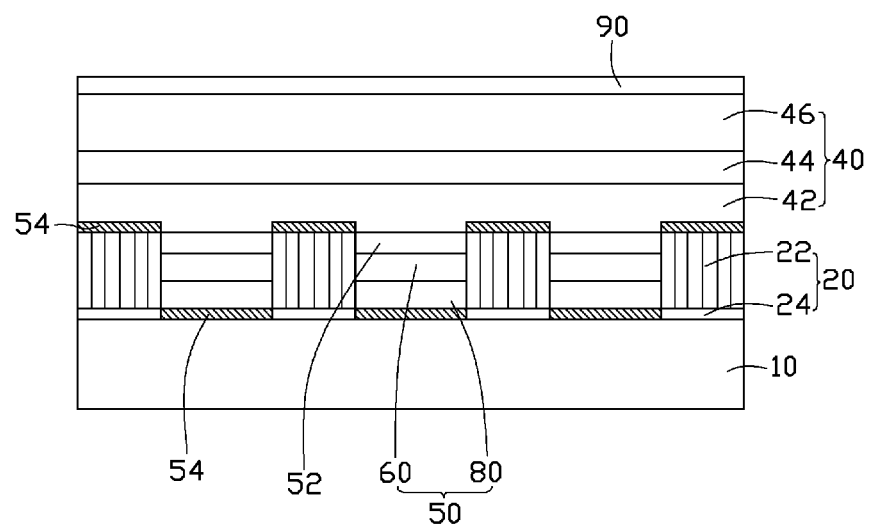
FIG. 4 is a schematic view showing a semi-finished product obtained during a process of manufacturing the light emitting chip of FIG. 1.

Referring also to FIG. 4, a method for manufacturing the light emitting chip is also disclosed, comprises steps:

providing a conductive substrate 10 with a catalyst layer 24, and forming a plurality of chunks spaced from each other by the catalyst layer 24 on the substrate 10;

vertically growing a plurality of carbon nanotube layers 22 on the chunks to form a first semiconductor structure 100, wherein the carbon nanotube layers 22 are spaced from each other;

forming an epitaxial structure 40 on a temporary substrate 90, wherein the epitaxial structure 40 comprises a second semiconductor layer 46, a light emitting layer 44 and a first semiconductor layer 42 formed on the temporary substrate 90 in sequence;

forming a current conducting structure 50 on the first semiconductor layer 42 to form a second semiconductor structure 200 together with the epitaxial structure 40, wherein the current conducting structure 50 comprises a first transparent conductive layer 60 and a current conducting layer 80;

etching the current conducting structure 50 to define a plurality of holes 51 in the current conducting structure 50; in an embodiment, after forming the holes 51, etching the first semiconductor layer 42 to define recesses 48, wherein a depth of each recess 48 is less than a thickness of the first semiconductor layer 42; in an alternative embodiment, only etching the current conducting structure 50 to form the holes 51 without forming the recesses 48 in the first semiconductor layer 42;

bonding the first and second semiconductor structures 100, 200 together by wafer bonding; wherein the carbon nanotube layers 22 are fitly embedded into the holes 51 of the current conducting structure 50 in such a manner that the carbon nanotube layers 22 are attached to the first semiconductor layer 42 and the current conducting structure 50 is attached to the substrate 10 via an adhesive layer 54 between the first and second semiconductor structures 100, 200;

removing the temporary substrate 90 from the second semiconductor layer 46 by laser, chemical etching, physical etching or milling;

forming a second transparent conductive layer 62 on the top surface of the second semiconductor layer 46; and forming a first electrode 70 and a second electrode 72 on the bottom surface of the substrate 10 and the central part of the top surface of the second transparent conductive layer 62, respectively.

It is understood that the above-mentioned steps may further comprise a step of forming an ohmic contact layer 52 between the first transparent conductive layer 60 and the first semiconductor layer 42 before forming the current conducting structure 50 on the first semiconductor layer 42. In the step of etching the current conducting structure 50, the ohmic contact layer 52 is also etched together.

Figure 3:
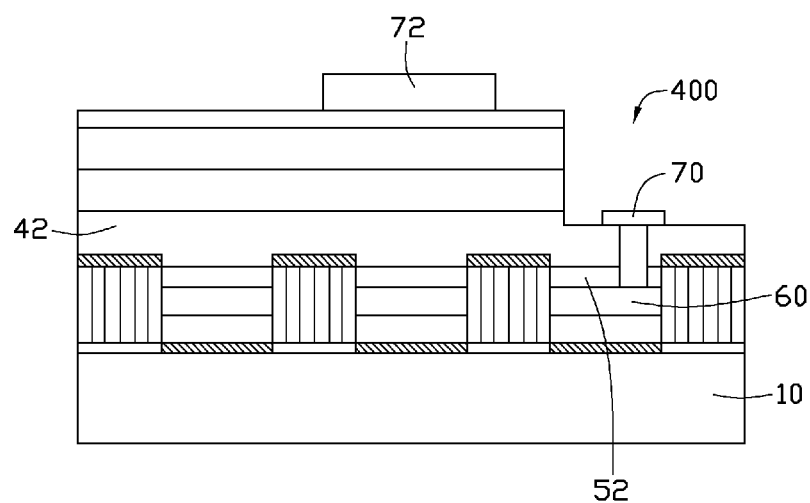
FIG. 3 shows a light emitting chip in accordance with a second embodiment of the present disclosure.

In the first embodiment, the substrate 10 is conductive. FIG. 3 shows a light emitting chip in accordance with a second embodiment of the disclosure which has a nonconductive substrate 10. The light emitting chip has a structure similar to that of the first embodiment except a location of the first electrode 70. The light emitting chip is etched to form a recess 400 in a lateral side thereof to expose the first semiconductor layer 42 and the first transparent conductive layer 60. The first electrode 70 is directly formed on the first semiconductor layer 42 and connected to the first transparent conductive layer 60. Due to the difference between the locations of the first electrodes 70 of the first and second embodiments, the last step of manufacturing the light emitting chip of the second embodiment is forming the recess 400 in the lateral side of the light emitting chip to expose the first semiconductor layer 42 and the first transparent conductive layer 60, forming the first electrode 70 on the first semiconductor layer 42 and connecting to the first transparent conductive layer 60, and forming a second electrode 72 on the top surface of the second transparent conductive layer 62.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A light emitting chip comprising:
    a substrate;
    an epitaxial structure comprising a first semiconductor layer, a light emitting layer stacked on a top side of the first semiconductor layer and a second semiconductor layer stacked on a top side of the light emitting layer;
    a current conducting structure formed on a bottom side of the first semiconductor layer of the epitaxial structure; and
    a plurality of heat conducting protrusions formed on a top side of the substrate, each of the heat conducting protrusions comprising a carbon nanotube layer vertically grown thereon;

wherein the heat conducting protrusions are embedded into the current conducting structure and thermally connecting with the first semiconductor layer.

2. The light emitting chip of claim 1, wherein the heat conducting protrusions are spaced from each other.

3. The light emitting chip of claim 1, wherein each of the heat conducting protrusions further comprises a catalyst layer directly formed on a top surface of the substrate, the carbon nanotube layer being vertically grown from the catalyst layer.

4. The light emitting chip of claim 1, wherein the current conducting structure comprises a first transparent conductive layer and a current conducting layer formed on a top side of the first semiconductor layer.

5. The light emitting chip of claim 4, wherein the current conducting layer is a distributed bragg reflector.

6. The light emitting chip of claim 4, wherein an ohmic contact layer is formed between the first transparent conductive layer and the first semiconductor layer.

7. The light emitting chip of claim 6, wherein the heat conducting protrusions are embedded into the first semiconductor layer through the current conducting layer, the first transparent conductive layer and the ohmic contact layer.

8. The light emitting chip of claim 7, wherein an adhesive layer is formed on a contact surface between the first semiconductor layer and the heat conducting protrusions, a bottom surface of the current conducting structure being attached to a top surface of the substrate via an additional adhesive layer.

9. The light emitting chip of claim 6, wherein a second transparent conductive layer is formed on a top side of the second semiconductor layer, an electrode being formed on the second transparent conductive layer.

10. The light emitting chip of claim 9, wherein the substrate is conductive, an additional electrode being formed on the substrate.

11. The light emitting chip of claim 9 further comprising an additional electrode, wherein the light emitting chip defines a recess to expose the first semiconductor layer and the first transparent conductive layer, the additional electrode being formed on the first semiconductor layer and connected to the first transparent conductive layer.

12. A method for manufacturing a light emitting chip, comprising steps:
a) providing a first substrate and a second substrate;
b) forming a plurality of heat conducting protrusions on a side of the first substrate, each of the heat conducting protrusions comprising a carbon nanotube layer vertically grown from the side of the first substrate;
c) forming a second semiconductor layer, a light emitting layer and a first semiconductor layer on the second substrate in sequence;
d) forming a current conducting structure on the first semiconductor layer, and fixing the current conducting structure to the first substrate, the heat conducting protrusions being embedded into the current conducting structure to thermally connect with the first semiconductor layer; and
e) removing the second substrate from the second semiconductor layer.

13. The method of claim 12, wherein the step b) further comprises a step of forming a catalyst layer having a plurality of chunks spaced from each other on the first substrate before growing the carbon nanotube layers, the carbon nanotube layers being grown on the chunks and being spaced from each other.

14. The method of claim 12, wherein the current conducting structure comprises a first transparent conductive layer and a current conducting layer formed on the first semiconductor layer in sequence.

15. The method of claim 14, wherein the current conducting layer is a distributed bragg reflector.

16. The method of claim 14, wherein an ohmic contact layer is formed between the first transparent conductive layer and the first semiconductor layer, the heat conducting protrusions being embedded into the first semiconductor layer through the current conducting layer, the first transparent conductive layer and the ohmic contact layer.

17. The method of claim 16, wherein top surfaces of the heat conducting protrusions are bonded to a bottom surface of the first semiconductor layer by wafer bonding, a bottom surface of the current conducting layer being bonded to a top surface of the first substrate by wafer bonding.

18. The method of claim 14 further comprising a step of forming a second transparent conductive layer and an electrode in sequence on the second semiconductor layer after the step e).

19. The method of claim 18 further comprising a step of forming an additional electrode on an opposite side of the first substrate after the step e), the first substrate being conductive.

20. The method of claim 18, wherein the first substrate is nonconductive, the light emitting chip defining a recess to expose the first semiconductor layer and the first transparent conductive layer, an additional electrode being formed on the first semiconductor layer and connected to the first transparent conductive layer.

* * * * *